US010147640B2

United States Patent
Liu

(10) Patent No.: US 10,147,640 B2
(45) Date of Patent: Dec. 4, 2018

(54) METHOD FOR REMOVING BACK-FILLED PORE-FILLING AGENT FROM A CURED POROUS DIELECTRIC

(71) Applicant: Tokyo Electron Limited, Tokyo (JP)

(72) Inventor: Junjun Liu, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 273 days.

(21) Appl. No.: 14/580,518

(22) Filed: Dec. 23, 2014

(65) Prior Publication Data
US 2015/0262865 A1 Sep. 17, 2015

Related U.S. Application Data

(60) Provisional application No. 61/950,949, filed on Mar. 11, 2014.

(51) Int. Cl.
| | |
|---|---|
| *H01L 21/44* | (2006.01) |
| *H01L 21/768* | (2006.01) |
| *H01L 21/3105* | (2006.01) |
| *H01L 21/311* | (2006.01) |
| *H01L 21/02* | (2006.01) |

(52) U.S. Cl.
CPC .... *H01L 21/76825* (2013.01); *H01L 21/3105* (2013.01); *H01L 21/31116* (2013.01); *H01L 21/31138* (2013.01); *H01L 21/7682* (2013.01); *H01L 21/76814* (2013.01); *H01L 21/76826* (2013.01); *H01L 21/02203* (2013.01); *H01L 2221/1047* (2013.01)

(58) Field of Classification Search
CPC ......... H01L 21/76802; H01L 21/76825; H01L 21/76883; H01L 21/76814; H01L 21/76826; H01L 21/7682; H01L 2221/1047; H01L 21/768
USPC .......... 438/620, 778–788, 795; 257/E21.24, 257/E21.241
See application file for complete search history.

(56) References Cited

U.S. PATENT DOCUMENTS

| | | | |
|---|---|---|---|
| 7,622,378 B2 | 11/2009 | Liu et al. | |
| 7,858,533 B2 | 12/2010 | Liu et al. | |
| 2010/0041248 A1* | 2/2010 | Liu ................... | H01L 21/67115 438/795 |
| 2011/0083887 A1* | 4/2011 | Brock ...................... | C07F 7/21 174/258 |
| 2011/0183525 A1 | 7/2011 | Purushothaman et al. | |

(Continued)

*Primary Examiner* — Charles Garber
*Assistant Examiner* — Abdulfattah Mustapha
(74) *Attorney, Agent, or Firm* — Oblon, McClelland, Maier & Neustadt, L.L.P.

(57) ABSTRACT

A method for preparing a porous dielectric is described. In particular, the method includes removing pore-filling agent from pores in a cured porous dielectric layer, wherein the pore-filling agent was back-filled within the pores following the removal of a pore-forming agent during a curing process. The removal of the pore-filling agent includes heating a substrate holder upon which the substrate rests to a holder temperature greater than 100 degrees C. and less than 400 degrees C., and while heating the substrate holder, exposing the substrate to electromagnetic (EM) radiation, wherein the EM radiation includes emission at a wavelengths within the ultraviolet (UV) spectrum, visible spectrum, infrared (IR) spectrum, or microwave spectrum, or combination thereof.

20 Claims, 7 Drawing Sheets

(56) References Cited

U.S. PATENT DOCUMENTS

| | | | | |
|---|---|---|---|---|
| 2012/0329273 A1* | 12/2012 | Bruce | ............... | H01L 21/02203 438/653 |
| 2013/0178061 A1* | 7/2013 | Yamamoto | ........ | H01L 21/02126 438/666 |
| 2014/0349478 A1* | 11/2014 | Koschinsky | ...... | H01L 21/02063 438/637 |

\* cited by examiner

METHOD FOR REMOVING BACK-FILLED PORE-FILLING AGENT FROM A CURED POROUS DIELECTRIC

CROSS-REFERENCE TO RELATED APPLICATIONS

Pursuant to 37 C.F.R. § 1.78(a)(4), this application claims the benefit of and priority to U.S. Provisional Application No. 61/950,949 filed on Mar. 11, 2014, which is expressly incorporated by reference herein in its entirety.

FIELD OF INVENTION

The invention relates to a method for preparing a low dielectric constant (low-k) dielectric film, patterning the low-k dielectric film, and integrating the low-k dielectric film with subsequently formed metal interconnects.

BACKGROUND OF THE INVENTION

Description of Related Art

As is known to those in the semiconductor art, interconnect delay is a major limiting factor in the drive to improve the speed and performance of integrated circuits (IC). One way to minimize interconnect delay is to reduce interconnect capacitance by using low dielectric constant (low-k) materials as the insulating dielectric for metal wires in the IC devices. Thus, in recent years, porous dielectrics have been developed to replace relatively high dielectric constant insulating materials, such as silicon dioxide. In particular, porous dielectrics are being utilized for inter-level and intra-level dielectric layers between metal wires in semiconductor devices. Porous dielectrics can be deposited by a spin-on dielectric (SOD) method similar to the application of photoresist, or by chemical vapor deposition (CVD). Thus, the use of porous dielectrics is readily adaptable to existing semiconductor manufacturing processes.

Porous dielectrics are less robust than more traditional silicon dioxide, and the mechanical strength deteriorates further with the degree of porosity. The porous dielectrics can easily be damaged during subsequent mechanical and chemical processing, thereby making desirable a mechanical strengthening or curing process. It has been understood that enhancement of the material strength of porous dielectrics is essential for their successful integration. Aimed at mechanical strengthening, alternative curing techniques are being explored to make porous dielectrics more robust and suitable for integration.

Once cured, porous dielectrics face yet additional challenges. When porous dielectric films are patterned for subsequent metallization, the dielectric can be easily damaged during exposure to plasma chemistry, such as the plasma chemistries used in etch and ash, causing the effective k value to increase after integration. The mechanism for plasma induced damage (PID) in low-k material is understood to be a result of diffusion of damaging species through the interconnected pores deep into the dielectric matrix, replacing carbon side groups with oxygen or hydrogen, and in turn, resulting in hydrophilic groups that attract moisture in the ambient. The increased dipole moment carried by moisture causes the effective k value to increase significantly, so as to negate the benefit of incorporating a lower k material.

To counter plasma induced damage, pore-filling and de-stuffing integration schemes are proposed. Therein, the porous structure is stuffed or filled with a sacrificial pore-filling agent in order to block the diffusion pathways of the damaging species generated in the plasma. Thereafter, the stuffing agent is to be removed, either after patterning or after full metallization. Clean removal of the stuffing agent is critical to successfully implement this integration scheme. To ensure clean removal, there are challenging material issues which can be overcome with innovative process technologies.

SUMMARY OF THE INVENTION

Embodiments of the invention relate to a method for preparing a porous dielectric film, patterning the porous dielectric film, and integrating the porous dielectric film with subsequently formed metal interconnects.

According to one embodiment, a method for preparing a porous dielectric is described. In particular, the method includes removing pore-filling agent from pores in a cured porous dielectric layer, wherein the pore-filling agent was back-filled within the pores following the removal of a pore-forming agent during a curing process. The removal of the pore-filling agent includes heating a substrate holder upon which the substrate rests to a holder temperature greater than 100 degrees C. and less than 400 degrees C., and while heating the substrate holder, exposing the substrate to electromagnetic (EM) radiation, wherein the EM radiation includes emission at a wavelengths within the ultraviolet (UV) spectrum, visible spectrum, infrared (IR) spectrum, or microwave spectrum, or combination thereof.

According to another embodiment, a method of preparing a porous dielectric is described. The method includes receiving a substrate with a cured porous dielectric layer formed thereon, the cured porous dielectric layer including: (i) pores formed by the removal of a pore-forming agent during a curing process and subsequently back-filled with a pore-filling agent, and (ii) a pattern formed therein using a patterning process that has been metallized and planarized, wherein the pores are characterized by an average pore diameter less than 10 nm, wherein a pattern spacing of the pattern is characterized by a dimension less than or equal to 50 nm, and further wherein the pore-filling agent as back-filled within the pores has a thermal decomposition temperature greater than 250 degrees C. and less than 450 degrees C. Additionally, the method includes removing the pore-filling agent from the pores in the cured porous dielectric layer by performing the following: heating a substrate holder upon which the substrate rests to a holder temperature greater than 100 degrees C. and less than 400 degrees C., and while heating the substrate holder, exposing the substrate to electromagnetic (EM) radiation, wherein the EM radiation includes emission at a wavelengths within the ultraviolet (UV) spectrum, visible spectrum, infrared (IR) spectrum, or microwave spectrum, or combination thereof.

According to another embodiment, a method of preparing a porous dielectric is described. The method includes receiving a substrate with a cured porous dielectric layer formed thereon, the cured porous dielectric layer including pores formed by the removal of a pore-forming agent during a curing process and subsequently back-filled with a pore-filling agent, wherein the pores are characterized by an average pore diameter less than 10 nm, and further wherein the pore-filling agent as back-filled within the pores has a thermal decomposition temperature greater than 250 degrees C. and less than 450 degrees C. Additionally, the method includes removing the pore-filling agent from the pores in the cured porous dielectric layer by performing the following: heating a substrate holder upon which the substrate rests to a holder temperature greater than 100 degrees C. and less than 400 degrees C., and while heating the substrate holder, exposing the substrate to infrared (IR) radiation emitted by an IR source separate from the substrate holder.

According to yet another embodiment, a method of preparing a porous dielectric is described. The method includes receiving a substrate with a cured porous dielectric layer formed thereon, the cured porous dielectric layer including pores formed by the removal of a pore-forming agent during a curing process and subsequently back-filled with a pore-filling agent, wherein the pores are characterized by an average pore diameter less than 10 nm, and further wherein the pore-filling agent as back-filled within the pores has a thermal decomposition temperature greater than 250 degrees C. and less than 450 degrees C. Additionally, the method includes patterning the cured porous dielectric layer using a patterning process, exposing the substrate to first EM radiation following the patterning, metallizing the pattern and planarizing the substrate, and removing the pore-filling agent from the pores in the cured porous dielectric layer by exposing the substrate to second EM radiation following the metallizing.

DETAILED DESCRIPTION OF SEVERAL EMBODIMENTS

Figure 1A:
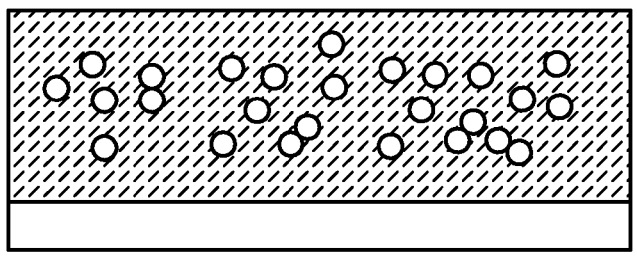
FIGS. 1A through 1H illustrate a method of preparing a porous dielectric on a substrate according to an embodiment.

Methods for preparing a porous dielectric on a substrate, such as a microelectronic workpiece, are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

As briefly described above, to counter plasma induced damage, pore-filling and de-stuffing integration schemes are proposed. Therein, the porous structure is stuffed or filled with a sacrificial pore-filling agent in order to block the diffusion pathways of the damaging species generated in the plasma. Thereafter, the stuffing agent is to be removed, either after patterning or after full metallization. Clean removal of the stuffing agent is critical to successfully implement this integration scheme. To ensure clean removal, there are challenging material issues which can be overcome with innovative process technologies. According to several embodiments, methods are described for preparing a porous dielectric film, patterning the porous dielectric film, and integrating the porous dielectric film with subsequently formed metal interconnects.

FIGS. 1A through 1G illustrate a method for preparing a porous dielectric that includes back-filling a cured porous dielectric with pore-filling agent, and removing the pore-filling agent after subsequent processing of the back-filled cured porous dielectric, according to an embodiment. In FIG. 1A, a dielectric material, such as a low-k (low dielectric constant) or ultra-low-k dielectric, is deposited or formed on a substrate. The dielectric material can include a porous dielectric material, as shown, that is composed of a matrix or host material, and a pore-forming material. The dielectric material may be formed using a vapor deposition process, such as a chemical vapor deposition (CVD) process or plasma-enhanced CVD process, or it may be formed using a spin-on dielectric process.

The dielectric material may have a dielectric constant value (before drying and/or curing, or after drying and/or curing, or both) equal to or less than the dielectric constant of $SiO_2$, which is approximately 4 (e.g., the dielectric constant for thermal silicon dioxide can range from 3.8 to 3.9). In various embodiments of the invention, the dielectric material may have a dielectric constant (before drying and/or curing, or after drying and/or curing, or both) of less than 3.0, a dielectric constant of less than 2.5, or a dielectric constant ranging from 1.6 to 2.7.

The dielectric material may include at least one of an organic, inorganic, and inorganic-organic hybrid material. For example, the dielectric material may include an inorganic, silicate-based material, such as oxidized organosilane (or organo siloxane), or SiCOH-containing material, deposited using CVD techniques. Examples of such films include Black Diamond™ CVD organosilicate glass (OSG) films commercially available from Applied Materials, Inc., or Coral™ CVD films commercially available from Novellus Systems. Additionally, for example, the dielectric material can include single-phase materials, such as a silicon oxide-based matrix having terminal organic side groups that inhibit cross-linking during a curing process to create small voids (or pores). Additionally, for example, the dielectric material can include dual-phase materials, such as a silicon oxide-based matrix having inclusions of organic material (e.g., a porogen) that is decomposed and evaporated during a curing process.

Low-k materials are less robust than more traditional silicon dioxide, and the mechanical strength deteriorates further with the introduction of porosity. The porous low-k films can easily be damaged during plasma processing, thereby making desirable a mechanical strengthening process (or curing process). It has been understood that enhancement of the material strength of porous low-k dielectrics is essential for their successful integration. Aimed at mechanical strengthening, curing techniques are utilized to remove the pore-forming material and make porous low-k films more robust and suitable for integration.

Accordingly, once deposited, the dielectric material is cured to increase the mechanical strength of the dielectric material, e.g., Young's modulus (E) and hardness (H), and the pore-forming material is removed leaving behind a mechanically strengthened dielectric layer with pores. The strengthening of the matrix material is essential for subsequent processing, including chemical-mechanical planarization (CMP) following metallization. An exemplary curing process can include treatment of the dielectric material using ultraviolet (UV) radiation, infrared (IR) radiation, or thermal treatment, or any combination of two or more thereof. Additional details may be found in U.S. Pat. No. 7,622,378, entitled "Multi-Step System and Method for Curing a Dielectric Film", or U.S. Pat. No. 7,858,533, entitled "Method for Curing a Porous Low Dielectric Constant Dielectric Film", the content of which are incorporated by reference herein in their entirety.

Figure 1B:
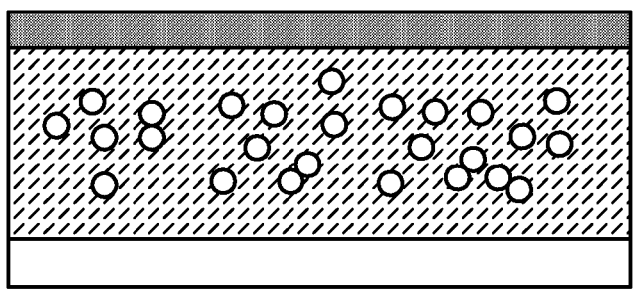
Figure 1C:
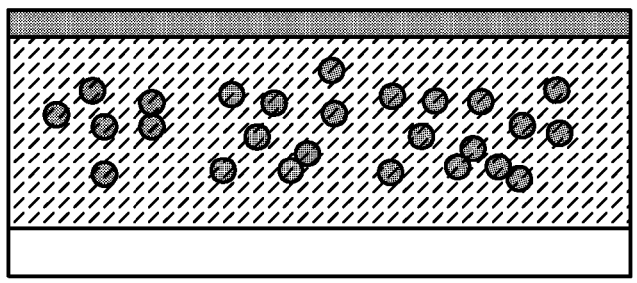
Figure 1D:
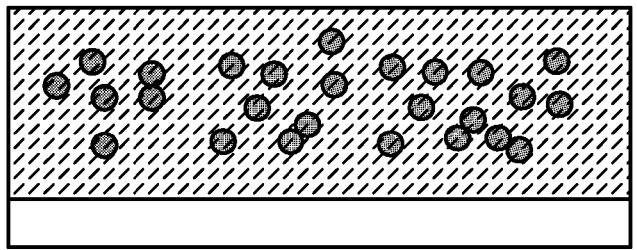

In FIG. 1B, a pore-filling agent layer is formed over the cured porous dielectric material. The pore-filling agent may be applied using a spin-coating process. Thereafter, as shown in FIG. 1C, the pore-filling agent is back-filled into the pores of the cured porous dielectric using, for example, a thermal treatment or annealing process. And in FIG. 1D, once the pores are at least partially back-filled, the residual pore-filling agent is removed.

The pore-filling agent should penetrate and fill the pores in the dielectric material, remain intact during the subsequent process steps until removal, and decompose cleanly during the removal process. To satisfy these requirements, the inventor(s) recommend a pore-filling agent that possesses: (i) a low molecular weight (for enhanced diffusion); (ii) a glass transition temperature higher than 250 degrees C. (to survive pre-CMP anneal), yet lower than 450 degrees C., preferably lower than 350 degrees C. (to ensure clean removal); (iii) a low viscosity at low temperature (for spin coating); and (iv) removability at high temperature.

With respect to the latter, the out-diffusion of the pore-filling agent from the dielectric matrix is not guaranteed due to its interaction with the surrounding materials, such as bonding with the dielectric matrix and diffusion barrier materials. And, the effect of the subsequent process steps, such as CMP induced top layer modification, can further inhibit removal pathways. Further yet, the need to control the thermal budget and throughput considerations may also weigh in on the selection of the pore-filling agent.

In at least some embodiments, the pore-filling agent used to back-fill the pores in the cured porous dielectric material may include an organic thermally labile material that decomposes at a temperature greater than the temperature at which at least one of the steps of preparing a mask layer and pattern etching the cured porous dielectric material is performed. As an example, the pore-filling agent may have a decomposition temperature in the range of about 250 degrees C. to about 450 degrees C. Alternatively, the pore-filling agent may have a decomposition temperature in the range of about 250 degrees C. to about 400 degrees C. Alternatively, the pore-filling agent may have a decomposition temperature in the range of about 250 degrees C. to about 350 degrees C. Alternatively yet, the pore-filling agent may have a decomposition temperature in the range of about 300 degrees C. to about 350 degrees C. Furthermore, as an example, the pore-filling agent may have a molecular weight in the range of about 10 g/mol to about 10000 g/mol. Further yet, as an example, the pore-filling agent may include poly(methyl methacrylate) (PMMA).

Figure 1E:
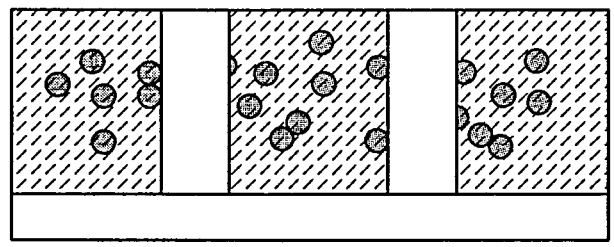

In FIG. 1E, the cured porous dielectric material is patterned to form a pattern therein using a patterning process. The patterning process can include a plasma etching process that utilizes a pattern mask formed of one or more layers using lithographic techniques. Thereafter, the remaining pattern mask is removed using an ashing process, which may include a plasma ashing process. The pore-filling agent back-filled within the pores of the cured porous dielectric material can protect the cured porous dielectric material from damage resulting from the plasma etching and/or ashing chemistry.

Figure 1F:
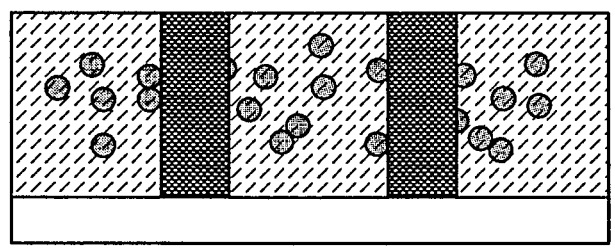

In FIG. 1F, the structure is metallized, wherein at least a portion of the cap layer is exposed. The metallization process may include conformally depositing a barrier layer on the substrate, filling the structure with metal, performing a pre-planarization anneal process, and planarizing the metallized structure to the cap layer in order to expose the cap layer. For example, the metallization process may include a damascene process, or a dual damascene process.

Figure 1G:
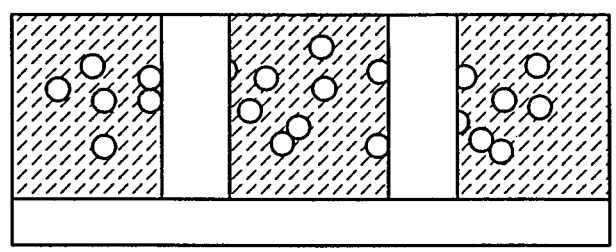
Figure 1H:
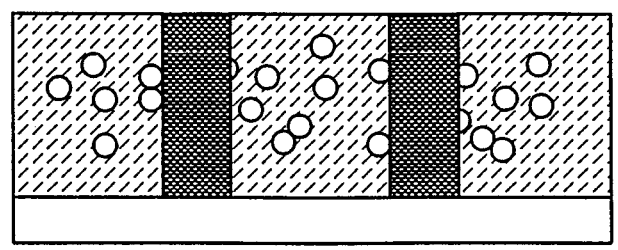

In FIG. 1G, the pore-filling agent is removed from the pores in the cured porous dielectric material following the patterning of the cured porous dielectric material and prior to metallization of the pattern formed therein. In FIG. 1H, the pore-filling agent is removed from the pores in the cured porous dielectric material following the metallization of the pattern formed therein.

In various embodiments, the removal of the pore-filling agent may include: (a) irradiation by high energy photons, ions, or electrons to induce scission of the pore-filling agent, resulting in smaller molecules to ease diffusion out of the dielectric; (b) addition of reactive species to either oxidize or hydrogenate the pore-filing agent, thus enhancing removability; (c) rapid selective heating of the dielectric, or the pore-filling agent, or other surrounding materials, resulting in mechanical stretching or vibration to enhance the out-diffusion; or (iv) any combination of two or more thereof.

Figure 2:
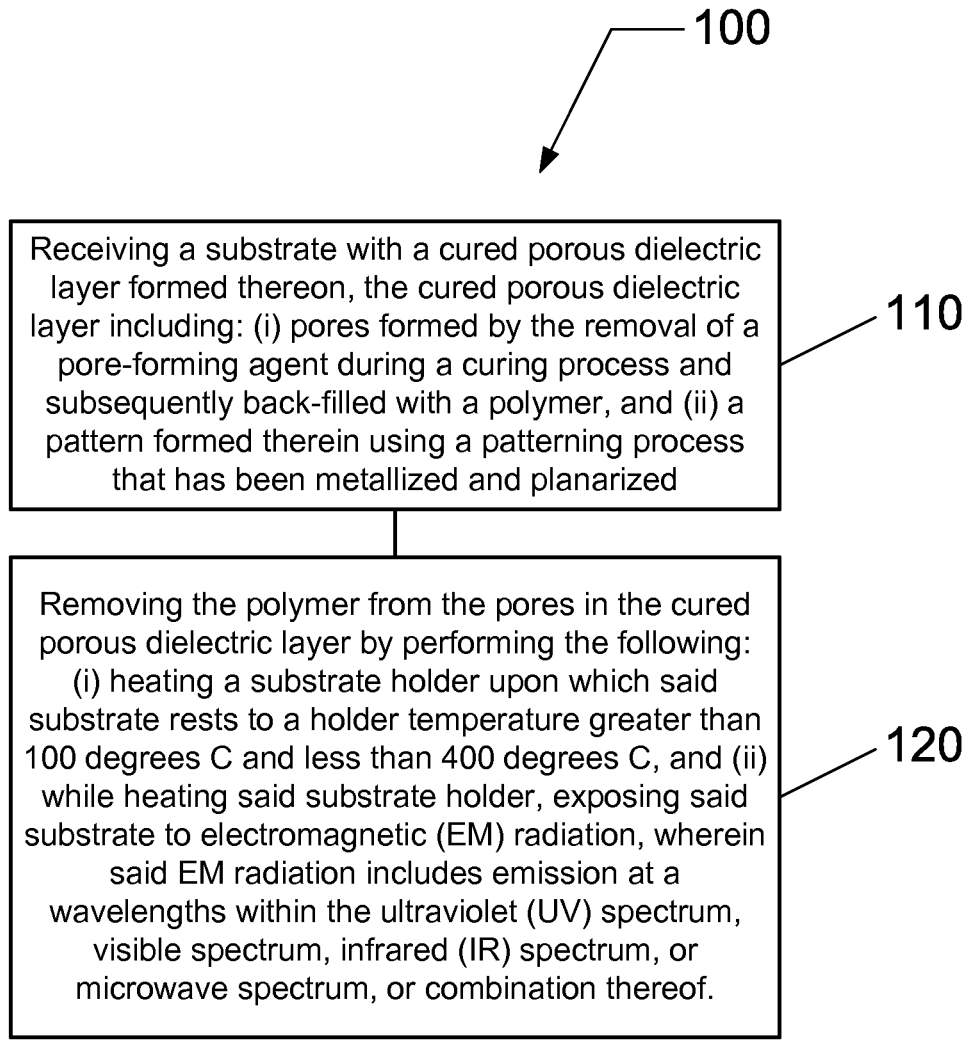
FIG. 2 is a flow chart of a method of preparing a porous dielectric on a substrate according to an embodiment.

According to one embodiment, FIG. 2 provides a flow chart 100 describing a method for preparing a porous dielectric according to an embodiment. In particular, the method includes receiving a substrate with a cured porous dielectric layer formed thereon in 110, wherein the cured porous dielectric layer includes: (i) pores formed by the removal of a pore-forming agent during a curing process and subsequently back-filled with a pore-filling agent, and (ii) a pattern formed therein using a patterning process that has been metallized and planarized. The pores are characterized by an average pore diameter less than 10 nm. A pattern spacing of the pattern is characterized by a dimension less than or equal to 50 nm. Alternatively, the pattern spacing of the pattern is characterized by a dimension less than or equal to 30 nm. And further, the pore-filling agent as back-filled within the pores has a thermal decomposition temperature greater than 250 degrees C. and less than 450 degrees C. Exemplary pore-filling agent is described above.

In 120, the pore-filling agent is removed from pores in the cured porous dielectric layer. The removal of the pore-filling agent includes heating a substrate holder upon which the substrate rests to a holder temperature greater than 100 degrees C. and less than 450 degrees C., or preferably less than 400 degrees C., and while heating the substrate holder, exposing the substrate to electromagnetic (EM) radiation, wherein the EM radiation includes emission at a wavelengths within the ultraviolet (UV) spectrum, visible spectrum, infrared (IR) spectrum, or microwave spectrum, or combination thereof.

During exposure, the substrate may be disposed within an oxidizing environment, or reducing environment. Additionally, the substrate may be disposed within an oxygen-containing environment, or a hydrogen-containing environment. For example, the oxidizing environment may include $O$, $O_2$, $O_3$, $CO$, $CO_2$, $NO$, $N_2O$, or $NO_2$, or mixtures thereof. Additionally, for example, the reducing environment may include $H_2$, $NH_3$, a hydrocarbon, or any combination of two or more thereof, or any derivative thereof.

Alternatively, the ambient environment may be inert relative to the materials on the substrate. For example, the ambient environment may include a noble gas, or high vacuum.

The EM radiation may include UV radiation. The UV radiation may include, or consist essentially of UV wavelengths greater than or equal to 200 nm. Alternatively, the UV radiation may include, or consist essentially of UV wavelengths greater than or equal to 220 nm. Alternatively, the UV radiation may include, or consist essentially of UV wavelengths greater than or equal to 240 nm. Alternatively, the UV radiation may include, or consist essentially of UV wavelengths greater than or equal to 300 nm. Longer UV wavelengths can lower the risk of damage to the dielectric, and reduce contamination of the metallized pattern.

The exposure to UV radiation may include substantially monochromatic radiation, or polychromatic radiation. The UV radiation may be applied continuously, or it may be pulsed. For example, the exposure to UV radiation may cycle between a high and low UV intensity, wherein an exposure time for exposure to said high UV intensity is less than 100 msec, or less than 10 msec, or less than 1 msec.

The exposure to UV radiation may further include exposure to IR radiation. The IR radiation may include substantially monochromatic radiation, or polychromatic radiation. The IR radiation may be applied continuously, or it may be pulsed. For example, the exposure to IR radiation may cycle between a high and low IR intensity, wherein an exposure time for exposure to said high IR intensity is less than 100 msec, or less than 10 msec, or less than 1 msec.

During exposure to EM radiation, the substrate may be translated, or rotated. Additionally, or alternatively, the EM radiation may be scanned across the substrate. Multiple beams of EM radiation may be produced and scanned across the substrate to improve throughput. Multiple passes of a beam of EM radiation may be performed to achieve the desired level of pore-filling agent removal. As an example, the substrate may be exposed to UV radiation, such as a UV flash exposure, followed by selective heating via a beam of EM radiation, such as UV or IR. Furthermore, the condition of the dielectric may be monitored to assess the degree of pore-filling agent removal. As an example, the monitoring system may include a laser interferometer to measure changes in reflectivity.

Figure 3:
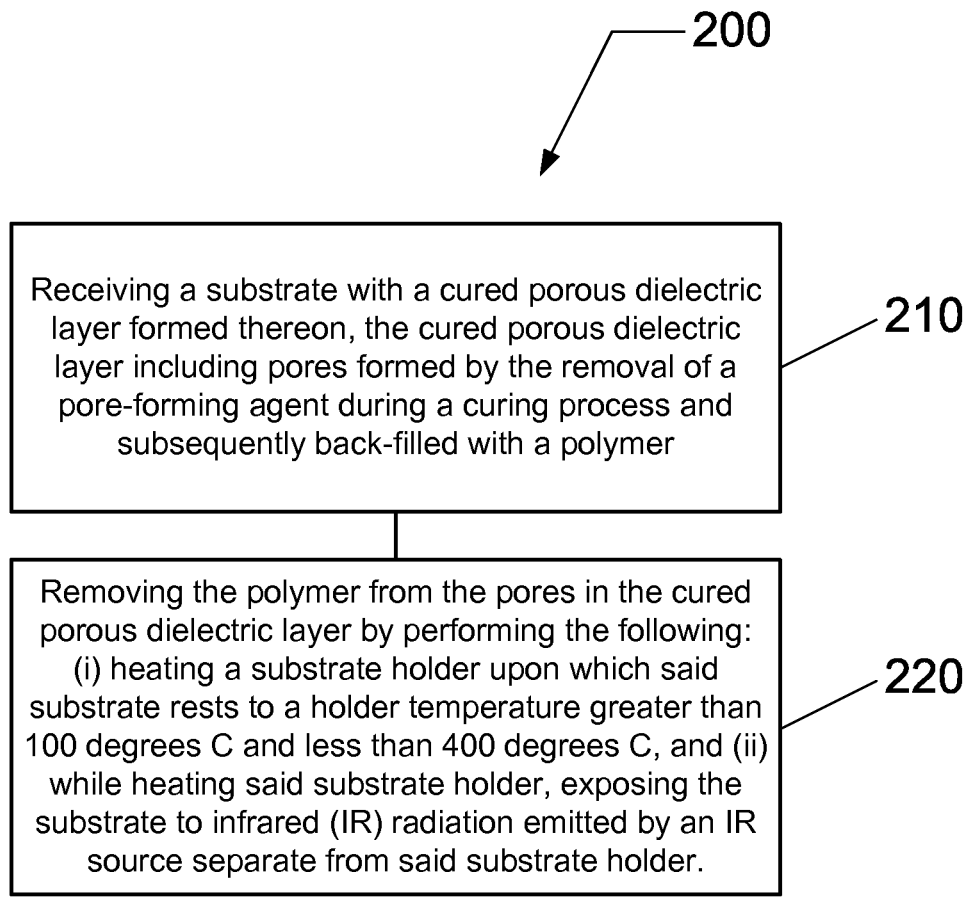
FIG. 3 is a flow chart of a method of preparing a porous dielectric on a substrate according to another embodiment.

According to another embodiment, FIG. 3 provides a flow chart 200 describing a method of preparing a porous dielectric. The method includes receiving a substrate with a cured porous dielectric layer formed thereon in 210. The cured porous dielectric layer includes pores formed by the removal of a pore-forming agent during a curing process and subsequently back-filled with a pore-filling agent. The pores are characterized by an average pore diameter less than 10 nm. And further, the pore-filling agent as back-filled within the pores has a thermal decomposition temperature greater than 250 degrees C. and less than 450 degrees C. Exemplary pore-filling agent is described above.

In 220, the pore-filling agent is removed from pores in the cured porous dielectric layer. The removal of the pore-filling agent includes removing the pore-filling agent from the pores in the cured porous dielectric layer by performing the following: heating a substrate holder upon which the substrate rests to a holder temperature greater than 100 degrees C. and less than 450 degrees C., or preferably less than 400 degrees C., and while heating the substrate holder, exposing the substrate to infrared (IR) radiation emitted by an IR source separate from the substrate holder.

The exposure to IR radiation may elevate the local temperature of the substrate, at least momentarily, above 400 degrees C., or alternatively above 450 degrees C., or alternatively yet above 500 degrees C. The exposure to IR radiation to remove pore-filling agent may be performed following the patterning of the dielectric material, yet prior to metallization and planarization of the pattern. Alternatively, the exposure to IR radiation may be performed following the metallization and planarization of the patterned, cured porous dielectric material.

The removal process may include exposure to IR radiation via localized irradiation of the substrate with a beam of IR radiation, and scanning the beam of IR radiation across the substrate. The removal process may further include exposing the substrate to UV radiation. As an example, the UV radiation may include a flash exposure that precedes the IR exposure.

Figure 4:
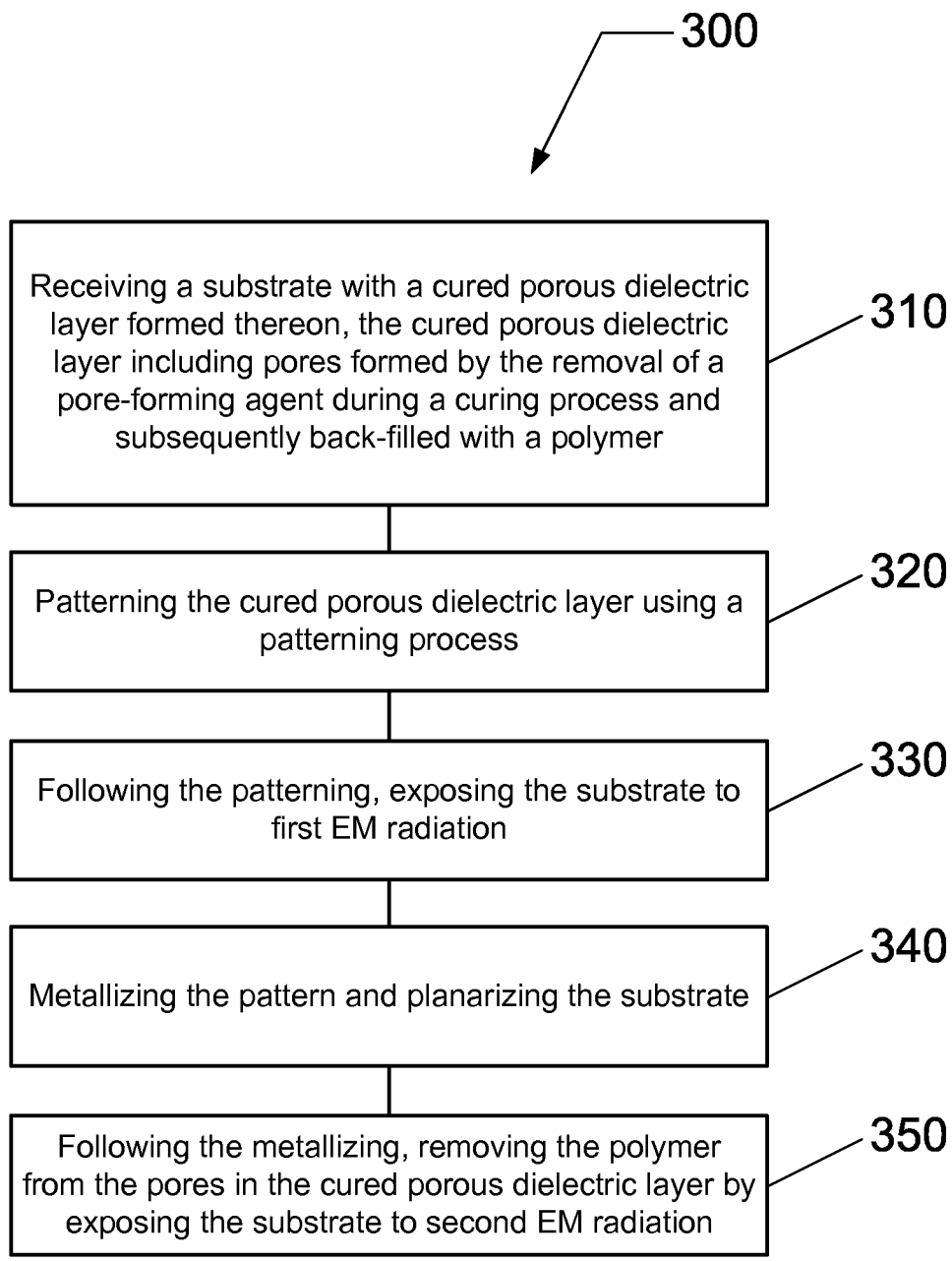
FIG. 4 is a flow chart of a method of preparing a porous dielectric on a substrate according to yet another embodiment.

According to yet another embodiment, FIG. 4 provides a flow chart 300 describing a method of preparing a porous dielectric is described. The method includes receiving a substrate with a cured porous dielectric layer formed thereon in 310, wherein the cured porous dielectric layer includes pores formed by the removal of a pore-forming agent during a curing process and subsequently back-filled with a pore-filling agent. The pores are characterized by an average pore diameter less than 10 nm. And further, the pore-filling agent as back-filled within the pores has a thermal decomposition temperature greater than 250 degrees C. and less than 450 degrees C.

In 320, the cured porous dielectric layer is patterned using a patterning process.

In 330, the substrate is exposed to first EM radiation following the patterning. The first EM radiation may include first UV radiation at a first UV wavelength.

In 340, the pattern is metallized and planarized.

In 350, the pore-filling agent is removed from the pores in the cured porous dielectric layer by exposing the substrate to second EM radiation following the metallizing. The second EM radiation may include second UV radiation at a second UV wavelength. The first and second UV wavelengths may be the same or different from one another.

Figure 5:
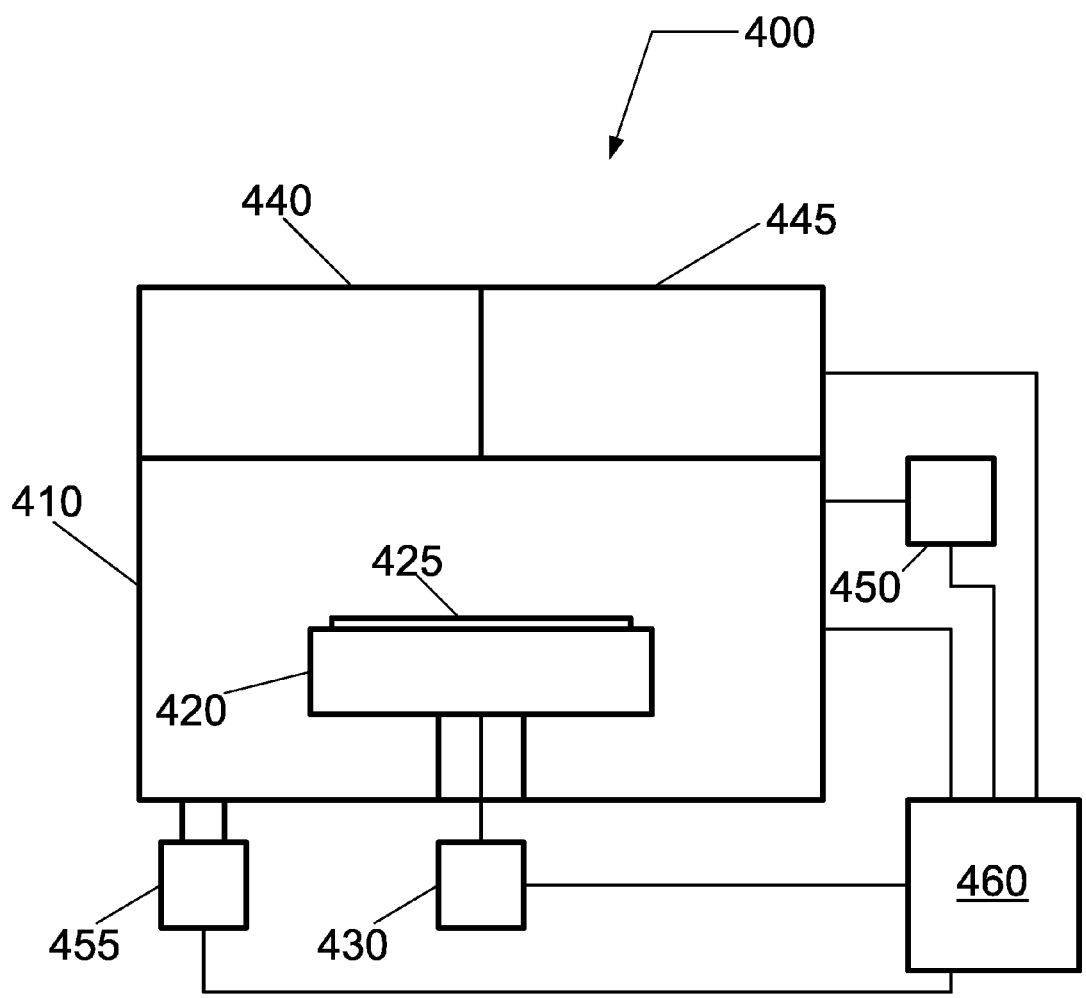
FIG. 5 is a schematic cross-sectional view of a processing system according to an embodiment.

Referring now to FIG. 5, a pore-filling agent removal system 400 is shown according to another embodiment. Pore-filling agent removal system 400 includes a process chamber 410 configured to produce a clean, contaminant-free environment for treating a substrate 425 resting on substrate holder 420. Pore-filling agent removal system 400 further includes one or more radiation sources configured to expose substrate 425 having the dielectric film to electromagnetic (EM) radiation at single, multiple, narrow-band, or broad-band EM wavelengths. The one or more radiation sources can include an IR radiation source 440 and a first UV radiation source 445. The exposure of the substrate to UV radiation and IR radiation can be performed simultaneously, sequentially, or over-lapping one another. Additionally, the one or more radiation sources may include a second UV radiation source (not shown) configured to irradiate substrate 425 at a wavelength, or range of wavelengths, different than the first UV radiation source 445.

The IR radiation source 440 may include a broad-band IR source, or may include a narrow-band IR source. The IR radiation source may include one or more IR lamps, one or more IR LEDs, or one or more IR lasers (continuous wave (CW), tunable, or pulsed), or any combination thereof. The IR power may range from approximately 0.1 mW to approximately 2000 W. The IR radiation wavelength may range from approximately 1 micron to approximately 25 microns and, desirably, can range from approximately 8 microns to approximately 14 microns. For example, the IR radiation source 440 may include an IR element, such as a ceramic element or silicon carbide element, having a spectral output ranging from approximately 1 micron to approximately 25 microns, or the IR radiation source 440 can include a semiconductor laser (diode), or ion, Ti:sapphire ($Al_2O_3$), or dye laser with optical parametric amplification. The IR radiation source 440 may include a gas laser, such as a $CO_2$ laser at 10.6 micron, or a modified $CO_2$ laser at 9.4 micron.

The first UV radiation source 445 (and the optional second UV radiation source) may include a broad-band UV source, or may include a narrow-band UV source. The first and second UV radiation sources may include one or more UV lamps, one or more UV LEDs, or one or more UV lasers (continuous wave (CW), tunable, or pulsed), or any combination thereof. UV radiation may be generated, for instance, from a microwave source, an arc discharge, a dielectric barrier discharge, or electron impact generation. The UV power density may range from approximately 0.1 mW/cm$^2$ to approximately 2000 mW/cm$^2$. The UV wavelength may range from approximately 100 nanometers (nm) to approximately 600 nm and, desirably, may range from approximately 200 nm to approximately 400 nm. For example, the first UV radiation source 445 may include a direct current (DC) or pulsed lamp, such as a Deuterium ($D_2$) lamp, having a spectral output ranging from approximately 180 nm to approximately 500 nm, or the first UV radiation source 445 may include a semiconductor laser (diode), (nitrogen) gas laser, frequency-tripled Nd:YAG laser, or copper vapor laser.

The IR radiation source 440, or the first UV radiation source 445 (and the optional second UV radiation source) may include any number of optical devices to adjust one or more properties of the output radiation. For example, each source may further include optical filters, optical lenses, beam expanders, beam collimators, etc. Such optical manipulation devices as known to those skilled in the art of optics and EM wave propagation are suitable for the invention.

The substrate holder 420 can further include a temperature control system that can be configured to elevate and/or control the temperature of substrate 425. The temperature control system can be a part of a thermal treatment device 430. The substrate holder 420 can include one or more conductive heating elements embedded in substrate holder 420 coupled to a power source and a temperature controller. For example, each heating element can include a resistive heating element coupled to a power source configured to supply electrical power. The substrate holder 420 may optionally include one or more radiative heating elements. The temperature of substrate 425 can, for example, range from approximately 20 degrees C. to approximately 500 degrees C., and desirably, the temperature may range from approximately 100 degrees C. to approximately 400 degrees C.

Additionally, the substrate holder 420 may or may not be configured to clamp substrate 425. For instance, substrate holder 420 may be configured to mechanically or electrically clamp substrate 425.

Referring again to FIG. 5, pore-filling agent removal system 400 can further include a gas injection system 450 coupled to the process chamber 410 and configured to introduce a purge gas to process chamber 410. The purge gas can, for example, include an inert gas, such as a noble gas or nitrogen. Alternatively, the purge gas can include other gases, such as for example $H_2$, $NH_3$, $C_xH_y$, or any combination thereof. Additionally, Pore-filling agent removal system 400 can further include a vacuum pumping system 455 coupled to process chamber 410 and configured to evacuate the process chamber 410. During a decomposition or curing process, substrate 425 can be subject to a purge gas environment with or without vacuum conditions.

Furthermore, pore-filling agent removal system 400 can include a controller 460 coupled to process chamber 410, substrate holder 420, thermal treatment device 430, optional IR radiation source 440, UV radiation source 445, gas injection system 450, and vacuum pumping system 455. Controller 460 includes a microprocessor, a memory, and a digital I/O port capable of generating control voltages sufficient to communicate and activate inputs to the pore-filling agent removal system 400 as well as monitor outputs from the pore-filling agent removal system 400. A program stored in the memory is utilized to interact with the pore-filling agent removal system 400 according to a stored process recipe. The controller 460 can be used to configure any number of processing elements (410, 420, 430, 440, 445, 450, or 455), and the controller 460 can collect, provide, process, store, and display data from processing elements. The controller 460 can include a number of applications for controlling one or more of the processing elements. For example, controller 460 can include a graphic user interface (GUI) component (not shown) that can provide easy to use interfaces that enable a user to monitor and/or control one or more processing elements.

The controller 460 may be implemented as a DELL PRECISION WORKSTATION 610™. The controller 460 may also be implemented as a general purpose computer, processor, digital signal processor, etc., which causes a substrate processing apparatus to perform a portion or all of the processing steps of the invention in response to the controller 460 executing one or more sequences of one or more instructions contained in a computer readable medium. The computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

The controller 460 may be locally located relative to the pore-filling agent removal system 400, or may be remotely located relative to the pore-filling agent removal system 400 via an internet or intranet. Thus, the controller 460 can exchange data with the pore-filling agent removal system 400 using at least one of a direct connection, an intranet, and the internet. The controller 460 may be coupled to an intranet at a customer site (i.e., a device maker, etc.), or coupled to an intranet at a vendor site (i.e., an equipment manufacturer). Furthermore, another computer (i.e., controller, server, etc.) can access controller 460 to exchange data via at least one of a direct connection, an intranet, and the internet.

Furthermore, embodiments of this invention may be used as or to support a software program executed upon some form of processing core (such as a processor of a computer, e.g., controller 460) or otherwise implemented or realized upon or within a machine-readable medium. A machine-readable medium includes any mechanism for storing information in a form readable by a machine (e.g., a computer). For example, a machine-readable medium can include such as a read only memory (ROM); a random access memory (RAM); a magnetic disk storage media; an optical storage media; and a flash memory device, etc.

As described above with reference to FIGS. 1A through 1H, 2, and 3, the first UV exposure process and the second UV exposure process may be performed in the same pore-filling agent removal system (such as pore-filling agent removal system 400 in FIG. 5). Alternatively, the first UV exposure process and the second UV exposure process may be performed in separate Pore-filling agent removal systems (each of which may include components illustrated in FIG. 5). The pore-filling agent removal system may be coupled to a multi-element manufacturing system via a transfer system configured to transfer substrates into and out of the Pore-filling agent removal system. For example, the multi-element manufacturing system can permit the transfer of substrates to and from processing elements including such devices as etch systems, deposition systems, coating systems, patterning systems, metrology systems, and other material processing systems.

Figure 6:
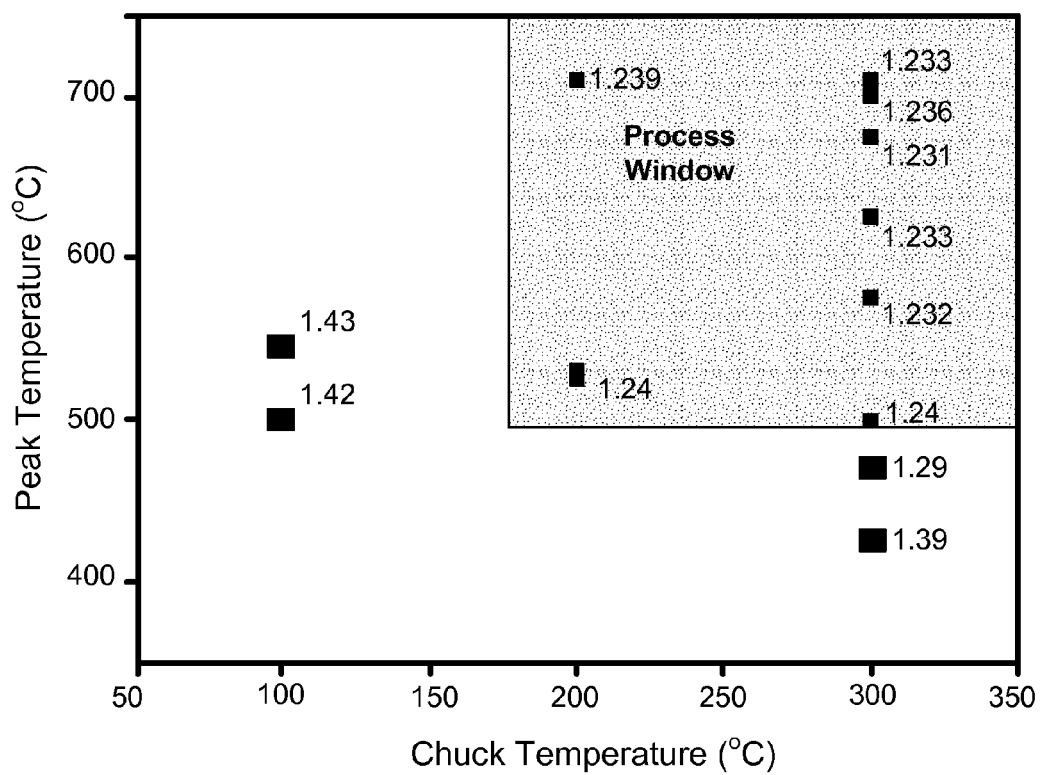
FIG. 6 presents exemplary data for decomposing a sacrificial material.

In FIG. 6, a cured porous dielectric is back-filled with a pore-filling agent that includes PMMA, and the pore-filling agent is removed using a scanning modified $CO_2$ IR laser at 9.4 microns. The substrate holder temperature is varied up to 350 degrees C., while the peak substrate, as measured using a pyrometer, is varied up to about 750 degrees C. The refractive index is measured and presented as a function of temperature. Under these conditions, the inventor(s) have observed essentially complete removal of the pore-filling agent at a substrate temperature above about 500 degrees C. and a substrate holder temperature ranging from about 200 degrees C. to about 350 degrees C.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of preparing a porous dielectric, comprising:
receiving a substrate with a cured porous dielectric layer formed thereon, said cured porous dielectric layer including: (i) pores formed by the removal of a pore-forming agent during a curing process and subsequently back-filled with a pore-filling agent, and (ii) a pattern formed therein using a patterning process that has been metallized and planarized, wherein said pores are characterized by an average pore diameter less than 10 nm, wherein a pattern spacing of said pattern is characterized by a dimension less than or equal to 50 nm, and further wherein said pore-filling agent as back-filled within said pores has a thermal decomposition temperature greater than 250 degrees C. and less than 450 degrees C.; and
removing said pore-filling agent from said pores in said cured porous dielectric layer by performing the following:
heating a substrate holder upon which said substrate rests to a holder temperature greater than 100 degrees C. and less than 400 degrees C., and
while heating said substrate holder, exposing said substrate to electromagnetic (EM) radiation by cycling between high and low EM intensity, wherein said EM radiation includes emission at a wavelength within the ultraviolet (UV) spectrum, visible spectrum, infrared (IR) spectrum, or microwave spectrum, or combination thereof.

2. The method of claim 1, wherein said exposing is performed in a reducing environment containing hydrogen.

3. The method of claim 2, wherein said reducing environment includes H2, NH3, a hydrocarbon, or any combination of two or more thereof, or any derivative thereof.

4. The method of claim 1, wherein said pore-filling agent includes a pore-filling agent having a molecular weight ranging from about 100 g/mol to about 10000 g/mol.

5. The method of claim 1, wherein said exposing comprises exposing to UV radiation.

6. The method of claim 5, wherein said exposure to UV radiation cycles between a high and low UV intensity, and wherein an exposure time for exposure to said high UV intensity is less than 100 msec.

7. The method of claim 5, wherein said exposure to UV radiation consists essentially of UV wavelengths greater than or equal to 200 nm.

8. The method of claim 5, wherein said exposing further comprises exposing to IR radiation.

9. The method of claim 1, wherein said exposing comprises exposing to IR radiation.

10. The method of claim 9, wherein said exposure to IR radiation cycles between a high and low IR intensity, and wherein an exposure time for exposure to said high IR intensity is less than 100 msec.

11. The method of claim 1, wherein an exposure time for exposure to said high EM intensity is less than 100 msec.

12. The method of claim 11, wherein said exposure to EM radiation comprises localized irradiation of said substrate with a beam of EM radiation, and scanning said beam of EM radiation across said substrate one or more passes.

13. A method of preparing a porous dielectric, comprising:
receiving a substrate with a cured porous dielectric layer formed thereon, said cured porous dielectric layer including pores formed by the removal of a pore-forming agent during a curing process and subsequently back-filled with a pore-filling agent, wherein said pores are characterized by an average pore diameter less than 10 nm, and further wherein said pore-filling agent as back-filled within said pores has a thermal decomposition temperature greater than 250 degrees C. and less than 450 degrees C.; and removing said pore-filling agent from said pores in said cured porous dielectric layer by performing the following:

heating a substrate holder upon which said substrate rests to a holder temperature greater than 100 degrees C. and less than 300 degrees C., and while heating said substrate holder, exposing said substrate to infrared (IR) radiation emitted by an IR source separate from said substrate holder.

14. The method of claim 13, wherein said exposing elevates a temperature of said substrate, at least momentarily, above 500 degrees C.

15. The method of claim 13, wherein said cured porous dielectric layer has been patterned to form a pattern therein, and said pattern has been metallized and planarized prior to said removing.

16. The method of claim 13, wherein said exposure to IR radiation comprises localized irradiation of said substrate with a beam of IR radiation, and scanning said beam of IR radiation across said substrate on one or more passes.

17. The method of claim 13, wherein said removing further comprises:

exposing said substrate to UV radiation.

18. The method of claim 13, wherein said removing further comprises:

flash exposing said substrate to UV radiation for an exposure time duration less than 100 msec.

19. A method of preparing a porous dielectric, comprising:

receiving a substrate with a cured porous dielectric layer formed thereon, said cured porous dielectric layer including pores formed by the removal of a pore-forming agent during a curing process and subsequently back-filled with a pore-filling agent, wherein said pores are characterized by an average pore diameter less than 10 nm, and further wherein said pore-filling agent as back-filled within said pores has a thermal decomposition temperature greater than 250 degrees C. and less than 450 degrees C.;

patterning said cured porous dielectric layer using a patterning process;

following said patterning, and before metallizing the pattern, exposing said substrate to first EM radiation;

metallizing said pattern and planarizing said substrate; and following said metallizing, removing said pore-filling agent from said pores in said cured porous dielectric layer by exposing said substrate to second EM radiation.

20. The method of claim 19, wherein said exposure to first EM radiation includes exposure to first UV radiation immediately following said patterning, and said exposure to second EM radiation includes exposure to second UV radiation immediately following said metallizing and planarizing.

* * * * *

UNITED STATES PATENT AND TRADEMARK OFFICE
CERTIFICATE OF CORRECTION

| | | |
|---|---|---|
| PATENT NO. | : 10,147,640 B2 | Page 1 of 1 |
| APPLICATION NO. | : 14/580518 | |
| DATED | : December 4, 2018 | |
| INVENTOR(S) | : Junjun Liu | |

It is certified that error appears in the above-identified patent and that said Letters Patent is hereby corrected as shown below:

On the Title Page

Item (56), insert --Office Action issued November 4, 2015 in Korean Patent Application No. 10-2015-0021723 (with English language translation)--.

In the Claims

In Column 12, Line 35, Claim 3, delete "H2, NH3," and insert --$H_2$, $NH_3$,--.

Signed and Sealed this
Fifth Day of May, 2020

Andrei Iancu
*Director of the United States Patent and Trademark Office*